United States Patent
Sakata et al.

(10) Patent No.: US 6,670,542 B2
(45) Date of Patent: Dec. 30, 2003

(54) SEMICONDUCTOR DEVICE AND MANUFACTURING METHOD THEREOF

(75) Inventors: Hitoshi Sakata, Higashiosaka (JP); Yasuo Kadonaga, Osaka (JP)

(73) Assignee: Sanyo Electric Co., Ltd., Osaka-Fu (JP)

( * ) Notice: Subject to any disclaimer, the term of this patent is extended or adjusted under 35 U.S.C. 154(b) by 19 days.

(21) Appl. No.: 09/747,956

(22) Filed: Dec. 27, 2000

(65) Prior Publication Data

US 2001/0008295 A1 Jul. 19, 2001

(30) Foreign Application Priority Data

Dec. 28, 1999 (JP) .......................... 11/372418

(51) Int. Cl.$^7$ ................. H01L 31/00; H01L 29/04; H01L 33/00
(52) U.S. Cl. ................. 136/258; 257/53; 438/96
(58) Field of Search ................ 136/258; 257/53; 438/96

(56) References Cited

U.S. PATENT DOCUMENTS

| | | | | |
|---|---|---|---|---|
| 4,721,535 A | * | 1/1988 | Itoh et al. | 136/249 |
| 4,892,594 A | * | 1/1990 | Fujiwara et al. | 136/258 |
| 5,066,340 A | * | 11/1991 | Iwamoto et al. | 136/258 |
| 5,213,628 A | | 5/1993 | Noguchi et al. | |
| 5,573,601 A | * | 11/1996 | Saitoh et al. | 136/258 |
| 5,682,037 A | * | 10/1997 | de Cesare et al. | 250/370.01 |
| 5,824,566 A | * | 10/1998 | Sano et al. | 136/256 |
| 6,165,844 A | * | 12/2000 | Chang | 438/260 |
| 6,187,150 B1 | * | 2/2001 | Yoshimi et al. | 136/252 |

OTHER PUBLICATIONS

Abstract of Japanese Patent Publ. No. 11–112011; dated Apr. 23, 1999.

* cited by examiner

*Primary Examiner*—Steven Loke
*Assistant Examiner*—Samuel A Gebremariam
(74) *Attorney, Agent, or Firm*—Arent Fox Kintner Plotkin & Kahn, PLLC

(57) ABSTRACT

This invention provides a photovoltaic semiconductor device of high efficiency capable of maintaining good interface characteristics of an amorphous semiconductor layer and a transparent electrode by eliminating damage caused by plasma of a plasma doping layer formed by doping impurity to the i-type amorphous semiconductor layer. The i-type amorphous semiconductor layer substantially not containing impurity for reducing electric resistance on a textured surface of an n-type single crystalline substrate. Then, the plasma doping layer is formed by exposing the n-type single crystalline substrate with the amorphous semiconductor layer formed thereon in an atmosphere of excited gas containing p-type impurity and diffusing the impurity to the amorphous semiconductor layer. A p-type amorphous semiconductor thin film layer containing p-type impurity is formed on the plasma doping layer by chemical vapor deposition and a transparent electrode 5 is formed on the p-type amorphous semiconductor thin film.

11 Claims, 2 Drawing Sheets

5 : transparent electrode
4 : p-type a-Si layer
3 : plasma doping layer
2 : i-type a-Si layer
1 : n-type single crystalline Si substrate
6 : rear surface electrode

SEMICONDUCTOR DEVICE AND MANUFACTURING METHOD THEREOF

BACKGROUND OF THE INVENTION

1. Field of the Invention

This invention relates to a photovoltaic element for generating photovoltaic power by incident light, and a semiconductor device having hetero junction such as a thin film transistor used in a liquid crystal display or the like and a manufacturing method thereof.

2. Description of the Prior Art

A photovoltaic element is generally categorized into single crystalline-, polycrystalline-, and amorphous-based type depending on a type of a semiconductor of a part for converting absorbed light mainly into electric current. A photovoltaic element including a crystalline substrate of crystalline semiconductor of single crystalline silicon or polycrystalline silicon, and an amorphous silicon semiconductor layer formed on the substrate and forming semiconductor junction between the crystalline substrate and the amorphous silicon semiconductor layer has been studied. For example, U.S. Pat. No. 5,213,628 discloses a photovoltaic element of this kind. In this photovoltaic element, an i-type intrinsic amorphous semiconductor layer of a few to 250 Å substantially not containing impurity is interposed on a junction interface in forming semiconductor junction by combining a crystalline semiconductor and an amorphous semiconductor having different conductivity from each other so as to improve interface characteristics and photovoltaic conversion characteristics. The i-type amorphous semiconductor layer interposed on the junction interface of the crystalline semiconductor and the amorphous semiconductor is preferred to be a film as thin as possible in order not to reduce light reaching to the crystalline semiconductor as a power generation layer, and it is formed to be not more than 100 Å.

A textured surface of the single crystalline silicon of a crystalline photovoltaic element using single crystalline silicon which has excellent photovoltaic conversion characteristics can reduce reflection and can utilize light effectively by elongating an optical path length in the semiconductor layer by scattering incident light. However, in a photovoltaic element of a structure which an i-type amorphous semiconductor layer is interposed on the junction interface between the crystalline semiconductor and the amorphous semiconductor as disclosed in U.S. Pat. No. 5,213,628, it is difficult to form a thin i-type amorphous semiconductor uniformly on a textured surface of the crystalline semiconductor. It is difficult to form the amorphous semiconductor on a projected part of the crystalline semiconductor by general plasma CVD in forming the very thin i-type amorphous semiconductor layer of a few–100 Å. Therefore, it is difficult to form a uniform thin film on the entire textured surface of the crystalline semiconductor by this method, and a thickness of the i-type amorphous semiconductor layer is required to be thick more than necessary in order to provide a high open circuit voltage, and light reaching to the crystalline semiconductor as a power generating layer reduces.

JP 11-112011, A discloses a method for solving the above problem. In this disclosure, an i-type amorphous semiconductor layer of a predetermined thickness is formed on a one conductive type crystalline semiconductor and an impurity layer is formed on the surface by exposing to plasma containing other conductive type impurity so that an i-type amorphous semiconductor layer is interposed on a junction interface between the crystalline semiconductor and the amorphous semiconductor to obtain high conversion efficiency.

In the above JP 11-112011, A, a reduced open circuit voltage caused by optical loss and uneven film thickness can be prevented, but the interface characteristics between the transparent conductive film formed on the semiconductor layer surface and the semiconductor is degraded because of damage on the surface of the amorphous semiconductor layer generated by plasma exposure on the amorphous semiconductor surface, resulting in degradation of F.F. (fill factor).

SUMMARY OF THE INVENTION

This invention was made to solve the existing problems and to provide a highly efficient semiconductor device by eliminating a damage caused by plasma and maintaining interface characteristics between the amorphous semiconductor layer and an electrode.

A semiconductor device of this invention comprises a one conductive type crystalline semiconductor substrate, an amorphous semiconductor layer not containing impurity for reducing electric resistance formed on the crystalline semiconductor substrate, an other conductive type amorphous semiconductor layer doped with other conductive type impurity formed by exposing the crystalline semiconductor substrate having the amorphous semiconductor layer formed thereon in an atmosphere of excited gas containing the other conductive type impurity, and an other conductive type amorphous semiconductor thin film formed on the other conductive type amorphous semiconductor layer by chemical vapor deposition.

A surface of the crystalline substrate is textured.

The semiconductor device of this invention has a structure of the other conductive type amorphous semiconductor layer that the i-type amorphous semiconductor layer not containing impurity, the other conductive type semiconductor layer with impurity diffused on the i-type amorphous semiconductor layer by plasma, and the amorphous semiconductor layer with impurity diffused by plasma are laminated on the one conductive type crystalline substrate. With this structure, even when the crystalline substrate with a textured surface is used, the i-type amorphous semiconductor layer of a predetermined thin film is uniformly formed and a good interface with little damage by plasma on an outermost surface of the amorphous semiconductor layer is formed.

The amorphous semiconductor layer substantially not containing impurity for reducing electric resistance formed on the crystalline semiconductor substrate is hydrogenated amorphous silicon, and the other conductive type amorphous semiconductor layer formed by doping other conductive type impurity to the hydrogenated amorphous silicon may be formed to be a thin film of 10–50 Å in thickness.

The amorphous semiconductor layer substantially not containing impurity for reducing electric resistance formed on the crystalline semiconductor substrate is hydrogenated amorphous silicon carbide, and the other conductive type amorphous semiconductor layer formed by doping other conductive type impurity to the hydrogenated amorphous silicon carbide may be formed to be a thin film of 20–100 Å in thickness.

The other conductive type amorphous semiconductor layer formed by CVD may be hydrogenated amorphous silicon carbide.

With this hydrogenated amorphous silicon carbide layer, when the other conductive type amorphous semiconductor thin film is a p-type amorphous semiconductor layer, a band gap can be wide and absorption of light can be reduced.

A manufacturing method of a semiconductor device of this invention comprises a process for forming an amorphous semiconductor layer substantially not containing impurity for reducing electric resistance on a surface of a one conductive type crystalline semiconductor substrate, a process for forming an other conductive type plasma doping layer by diffusing impurity on the amorphous semiconductor layer by exposing the crystalline semiconductor substrate with the amorphous semiconductor layer formed thereon in an atmosphere of excited gas containing other conductive type impurity, a process for forming an amorphous semiconductor thin film layer containing the other conductive type impurity by chemical vapor deposition on the plasma doping layer.

A surface of the crystalline substrate is textured.

The amorphous semiconductor layer substantially not containing the impurity for reducing electric resistance formed on the crystalline semiconductor substrate is hydrogenated amorphous silicon, and the other conductive type plasma doping layer is formed to be a thin film of 10–50 Å.

The amorphous semiconductor layer substantially not containing the impurity for reducing electric resistance on a surface of the crystalline semiconductor substrate is hydrogenated amorphous silicon carbide, and the other conductive type plasma doping layer is a thin film of 20–100 Å.

The process in this invention forms the i-type amorphous semiconductor layer not containing impurity, the other conductive type semiconductor layer with impurity diffused on the i-type amorphous semiconductor layer by plasma, and the conductive layer including the impurity for reducing electric resistance formed on the amorphous semiconductor layer with impurity diffused by plasma on the one conductive type crystalline substrate so as to be a very thin film. With this process, even when the crystalline substrate with a textured surface is used, the i-type amorphous semiconductor layer of a predetermined thin film is uniformly formed with this simple process and a good interface with little damage by plasma on an outermost surface of the amorphous semiconductor layer is formed.

The amorphous semiconductor layer substantially not containing impurity for reducing electric resistance formed on the crystalline semiconductor substrate is hydrogenated amorphous silicon carbide. The other conductive type amorphous semiconductor layer formed by doping other conductive type impurity to the hydrogenated amorphous silicon carbide may be formed to be a thin film of 20–100 Å in thickness.

The amorphous semiconductor layer substantially not containing impurity for reducing electric resistance formed on the crystalline semiconductor substrate is hydrogenated amorphous silicon. The crystalline semiconductor substrate with the hydrogenated amorphous silicon carbide layer substantially not containing impurity for reducing electric resistance formed thereon is exposed in an atmosphere with excited gas containing the other conductive type impurity and the impurity is diffused on the hydrogenated amorphous silicon carbide layer. Gas containing carbon may be mixed in the gas.

The plasma doping by the above method prevents a band gap from narrowing by impurity introduction.

The other conductive type amorphous semiconductor thin film layer formed by CVD is hydrogenated amorphous silicon carbide.

A reaction chamber for forming the amorphous semiconductor layer substantially not containing impurity for reducing electric resistance and a reaction chamber for forming the amorphous semiconductor thin film layer containing other conductive type impurity are separated, and a process for diffusing the impurity to the amorphous semiconductor layer by exposing the crystalline semiconductor substrate having the amorphous semiconductor layer formed thereon in an atmosphere of excited gas containing the other conductive type of impurity is conducted in the reaction chamber for forming the amorphous semiconductor thin film layer containing the other conductive type impurity.

Figure 1:
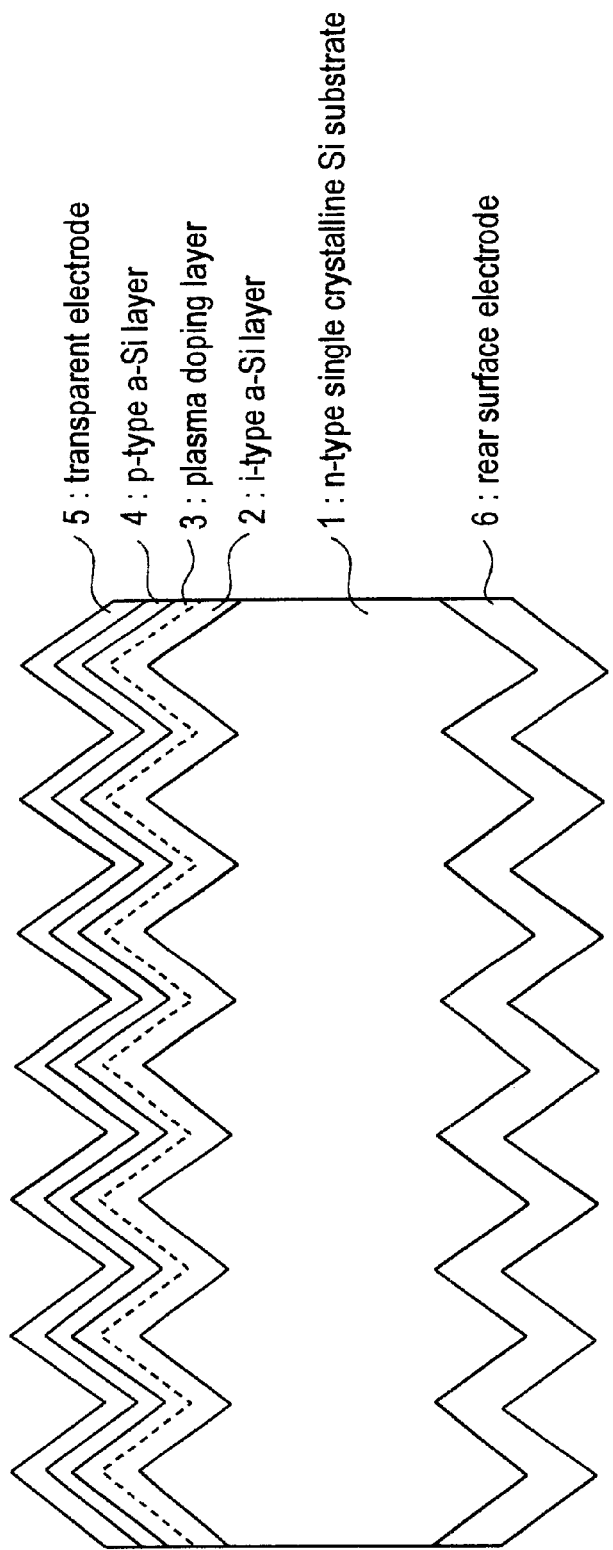
FIG. 1 is a cross sectional view illustrating a photovoltaic device according to one embodiment of this invention.

The foregoing and other objects, features, aspects and advantages of the present invention will become more apparent from the following detailed description of the present invention when reviewed in conjunction with the accompanying drawings.

DESCRIPTION OF PREFERRED EMBODIMENT(S)

Explanation is made of embodiments by referring to the drawings.

(First Embodiment)

FIG. 1 is a cross sectional view illustrating a structure of a photovoltaic device of the first embodiment according to the invention. A single crystalline silicon substrate 1 is an n-type single crystalline silicon (Si) substrate of resistivity not more than 5 Ω and 300 µm in thickness. A surface of the single crystalline silicon substrate 1 is textured by alkaline etching or the like.

An i-type hydrogenated amorphous silicon (a-Si) semiconductor layer 2 substantially not containing impurity is formed on a light receiving surface of the textured single crystalline silicon substrate 1. A thickness of the layer 2 is a few–250 Å. After the i-type hydrogenated amorphous silicon semiconductor layer of a predetermined thickness is formed by plasma CVD, the surface of the i-type hydrogenated amorphous silicon semiconductor layer is exposed to plasma containing impurity and turns into a p-type hydrogenated amorphous silicon semiconductor layer, and thus, becomes thinner than a layer formed by plasma CVD.

This i-type hydrogenated amorphous silicon layer 2 is provided in order to improve junction interface characteristics with the single crystalline silicon substrate 1, and the layer is preferred to be thin. The thickness should be not less than a few Å and it is preferred that introduction of impurity to the junction interface of the crystalline substrate 1 in introducing the impurity is securely prevented. Therefore, conditions of plasma exposure may be set so that the i-type hydrogenated amorphous silicon semiconductor layer 2 of not less than 10 Å is remained.

A p-type hydrogenated amorphous silicon semiconductor layer (a plasma doping layer) 3 having lower resistance is formed on the i-type hydrogenated amorphous silicon semiconductor layer 2 by exposing a surface of the i-type hydrogenated amorphous silicon semiconductor layer 2 to plasma containing impurity for reducing electric resistance. A thickness of the hydrogenated amorphous silicon semiconductor layer (a plasma doping layer) 3 is a few–100 Å. More dopant exists on a surface of the film as compared with a general film in forming the layer by plasma dope. Therefore, the layer can function as a p-type semiconductor layer even when it is thin. The thickness may be at least a few Å, it is preferred to be not less than 10 Å in order to reduce the thickness of the i-type hydrogenated amorphous silicon semiconductor layer 2 and improve yields.

A p-type hydrogenated amorphous silicon (a-Si) semiconductor layer 4 is formed on the hydrogenated amorphous silicon semiconductor layer 3 by plasma CVD. A thickness of the p-type hydrogenated amorphous silicon (a-Si) semiconductor layer 4 is a few–300 Å, preferably a few–150 Å.

A transparent electrode 5 of a transparent conductive film of ITO (Indium Tin Oxide) is formed on the p-type hydrogenated amorphous silicon (a-Si) semiconductor layer 4. A thickness of the transparent electrode 5 is 600–1500 Å, preferably 700–1200 Å. In addition, for example a comb-shaped collector electrode of Ag (not shown) is formed on the transparent electrode 5. A width of the collector electrode is 10–200 μm. A rear surface electrode 6 (not larger than 2 μm in thickness) is formed on a rear surface of the single crystalline silicon substrate 1.

Explanation is made of a manufacturing method of the photovoltaic device illustrated in FIG. 1.

The n-type single crystalline silicon substrate 1 having a textured surface formed by alkaline etching or the like is cleaned, is exposed to hydrogen plasma, and the surface is cleaned. Then, the i-type hydrogenated amorphous silicon semiconductor layer 2 of approximately 100 Å in thickness is formed on the textured light receiving surface of the single crystalline silicon substrate 1 by plasma CVD using silane ($SiH_4$) gas.

The single crystalline silicon substrate 1 with the i-type hydrogenated amorphous silicon semiconductor layer 2 formed thereon is exposed to plasma of diborane ($B_2H_6$) gas diluted by hydrogen ($H_2$). Boron atoms as impurity for reducing electric resistance is mixed to a certain depth from a surface of the i-type hydrogenated amorphous silicon semiconductor layer 2 and a lamination structure of the i-type hydrogenated amorphous silicon semiconductor layer 2 and the p-type hydrogenated amorphous silicon semiconductor layer 3 is formed. Conditions for plasma exposure are set so that the thickness of the p-type hydrogenated amorphous silicon semiconductor layer 3, or a plasma doping layer, is 10–50 Å in this embodiment. At this time, a damage layer by plasma is formed on the surface of the amorphous silicon semiconductor layer 3.

A second p-type hydrogenated amorphous silicon semiconductor layer 4 of approximately 20 Å is formed on the surface of the p-type hydrogenated amorphous silicon semiconductor layer 3 containing the plasma damage by plasma CVD of gas containing $SiH_4$, $B_2H_6$, and $H_2$ so as to improve interface characteristics with the transparent conductive film. In this case, it is required to maintain a state of the i-type hydrogenated amorphous silicon semiconductor layer 2 not containing the borons so that the good interface characteristics of the n-type single crystalline silicon substrate 1 and the p-type hydrogenated amorphous silicon semiconductor layer 3 formed by mixing the boron atoms is maintained. In addition, it is required to form the second p-type amorphous silicon semiconductor layer 4 of a very thin uniform textured film.

Table 1 is one example of the conditions. Under these conditions, the boron atoms are mixed to an approximately 50 Å depth from the surface of the i-type hydrogenated amorphous silicon semiconductor layer so as to form the p-type hydrogenated amorphous semiconductor layer and a part contacting the single crystalline silicon substrate 1 with the hydrogenated amorphous silicon semiconductor layer is maintained to have a thickness of approximately 50 Å of i-type. The second p-type hydrogenated amorphous silicon semiconductor layer is formed uniformly in a very thin textured surface.

TABLE 1

| | Substrate temperature (° C.) | Gas flow rate (sccm) | Pressure (Pa) | RF power (mW/cm$^2$) | Treating time (min) |
|---|---|---|---|---|---|
| i-type a-Si layer | 150 | $SiH_4$: 10 | 26.6 | 30 | |
| Plasma doping layer | 150 | $B_2H_6$: 1.0<br>$H_2$: 99 | 26.6 | 50~100 | 2~5 |
| p-type a-Si layer | 150 | $SiH_4$: 10<br>$B_2H_6$: 0.1<br>$H_2$: 9.9 | 26.6 | 30 | |

The transparent electrode 5 as a transparent conductive film is formed on the hydrogenated amorphous silicon semiconductor layer 4 by sputtering for targeting ITO. A comb-shaped collector electrode is pattern-formed on the transparent electrode 5 by depositing Ag using a metal mask. A rear surface electrode 6 of Al is deposited on a rear surface of the single crystalline silicon substrate 1.

When a reaction chamber for forming the i-type hydrogenated amorphous silicon semiconductor layer 2 and a reaction chamber for forming the p-type hydrogenated amorphous silicon semiconductor thin film layer 4 are separately formed, a process of plasma doping may be conducted in the reaction chamber for forming the p-type hydrogenated amorphous silicon semiconductor thin film layer 4.

In the above embodiment, the i-type hydrogenated amorphous silicon semiconductor layer 2 being relatively thick is formed at first and the i-type hydrogenated amorphous silicon semiconductor layer of a thin film is formed by mixing impurity even when the textured crystalline silicon substrate is used. Therefore, the i-type hydrogenated amorphous silicon semiconductor layer is formed on the entire area. And, a part of plasma damage is not left on the surface of the hydrogenated amorphous silicon semiconductor layer of the interface with the transparent electrode 5 as compared with the conventional case, and a good quality semiconductor device can be provided.

(Second Embodiment)

In the above first embodiment, the i-type hydrogenated amorphous silicon semiconductor layer is used as an amorphous silicon layer not containing impurity for reducing electric resistance. In the second embodiment, a hydrogenated amorphous silicon carbide (a-SiC) layer is substituted for the i-type hydrogenated amorphous silicon semiconductor layer. The hydrogenated amorphous silicon carbide has a wide optical band gap and can introduce more light to the single crystalline silicon substrate 1 than the hydrogenated amorphous silicon semiconductor layer not containing carbon (C) does. The thickness of each of the films can be larger when using the hydrogenated amorphous silicon carbide than when using the hydrogenated amorphous silicon semiconductor not containing carbon (C) described in the first embodiment.

A textured n-type single crystalline silicon substrate 1 formed by alkaline etching or the like is cleaned, exposed to hydrogen plasma, and the surface is cleaned. Then, an i-type hydrogenated amorphous silicon carbide layer 2 of approximately 150 Å is formed on a textured light receiving surface of the single crystalline silicon substrate 1 by plasma CVD using silane ($SiH_4$) and methane ($CH_4$).

Explanation is made of a manufacturing method of a photovoltaic device of the second embodiment.

The single crystalline substrate 1 with the i-type hydrogenated amorphous silicon carbide layer 2 formed thereon is exposed to plasma of diborane ($B_2H_6$) gas diluted with hydrogen ($H_2$). Through this process, a boron atom as impurity for reducing electric resistance is mixed to a certain depth from a surface of the i-type hydrogenated amorphous silicon carbide layer 2, and a lamination structure of the i-type hydrogenated amorphous silicon semiconductor layer 2 and the p-type hydrogenated amorphous silicon carbide layer 3 is formed. Conditions of plasma exposure are set so as to form the p-type hydrogenated amorphous silicon carbide layer 3, or a plasma doping layer, of 20–100 Å. At this time, a damage layer by plasma is formed on a surface of the p-type amorphous silicon carbide layer 3.

A second p-type hydrogenated amorphous silicon semiconductor layer 4 of approximately 20 Å is formed by plasma CVD with gas containing $SiH_4$, $B_2H_6$, $H_2$ on a surface of the p-type hydrogenated amorphous silicon carbide layer 3 containing plasma damage in order to improve interface characteristics with the transparent conductive film.

As described in the first embodiment, it is required to maintain a state of the i-type hydrogenated amorphous silicon carbide layer 2 not containing borons so that an interface of the n-type single crystalline silicon substrate 1 and the p-type hydrogenated amorphous silicon carbide layer 3 mixed with a boron atom maintain good interface characteristics. In addition, the second p-type amorphous silicon semiconductor layer 4 is required to be a very thin uniform textured surface.

One example of the above conditions is shown in Table 2. Under these conditions, the p-type hydrogenated amorphous silicon carbide layer is formed by mixing a boron atom to a depth of approximately 50 Å from the surface of the i-type hydrogenated amorphous silicon carbide layer and a part contacting the single crystalline silicon substrate 1 with the hydrogenated amorphous silicon carbide layer is maintained approximately 50 Å of i-type. In addition, the second p-type hydrogenated amorphous silicon semiconductor layer is formed uniformly in a very thin textured surface.

TABLE 2

| | Substrate temperature (° C.) | Gas flow rate (sccm) | Pressure (Pa) | RF power (mW/cm$^2$) | Treating time (min) |
|---|---|---|---|---|---|
| i-type a-SiC layer | 150 | $SiH_4$: 10 $CH_4$: 10 | 26.6 | 30 | |
| Plasma doping layer | 150 | $B_2H_6$: 1.0 $H_2$: 99 | 26.6 | 50~100 | 2~5 |
| p-type a-Si layer | 150 | $SiH_4$: 10 $B_2H_6$: 0.1 $H_2$: 9.9 | 26.6 | 30 | |

(Third Embodiment)

In the third embodiment, a hydrogenated amorphous silicon carbide layer is subsisted for the p-type hydrogenated amorphous silicon semiconductor layer 4 formed by plasma CVD. With this structure, the p-type amorphous semiconductor layer can have wide band gap with the hydrogenated amorphous silicon carbide layer, and absorption of light can be reduced. Conditions for forming the layers are shown in Table 3. Other processes same as in the second embodiment are omitted here.

TABLE 3

| | Substrate temperature (° C.) | Gas flow rate (sccm) | Pressure (Pa) | RF power (mW/cm$^2$) | Treating time (min) |
|---|---|---|---|---|---|
| i-type a-SiC layer | 150 | $SiH_4$: 10 ($CH_4$: 10) | 26.6 | 30 | |
| Plasma doping layer | 150 | $B_2H_6$: 1.0 $H_2$: 99 | 26.6 | 50~100 | 2~5 |
| p-type a-Si layer | 150 | $SiH_4$: 5 $CH_4$: 5 $B_2H_6$: 0.1 $H_2$: 9.9 | 26.6 | 30 | |

(Fourth Embodiment)

In the process of the third embodiment, the crystalline semiconductor substrate with the i-type hydrogenated amorphous silicon carbide layer formed thereon is exposed to plasma containing impurity for reducing electric resistance and the impurity are diffused on the i-type hydrogenated amorphous silicon carbide layer so as to form a plasma doping layer. In the fourth embodiment, $CH_4$ is introduced in the plasma. A narrowed band gap because of impurity introduction is prevented by the plasma doping of the above method. The conditions for forming the layers are shown in Table 4.

TABLE 4

| | Substrate temperature (° C.) | Gas flow rate (sccm) | Pressure (Pa) | RF power (mW/cm$^2$) | Treating time (min) |
|---|---|---|---|---|---|
| i-type a-SiC layer | 150 | $SiH_4$: 10 ($CH_4$: 10) | 26.6 | 30 | |
| Plasma doping layer | 150 | $B_2H_6$: 1.0 $H_2$: 99 $CH_4$: 10 | 26.6 | 50~100 | 2~5 |
| p-type a-Si layer | 150 | $SiH_4$: 5 ($CH_4$: 5) $B_2H_6$: 0.1 $H_2$: 9.9 | 26.6 | 30 | |

(Fifth Embodiment)

The fifth embodiment is an application of this invention not only to the p-n junction but also to high-low junction of the n-type crystalline semiconductor substrate and the n-type hydrogenated amorphous silicon base semiconductor layer. The fifth embodiment is about a two-side incidence type photovoltaic device that light is incident from both front and rear surfaces of the substrate.

Figure 2:
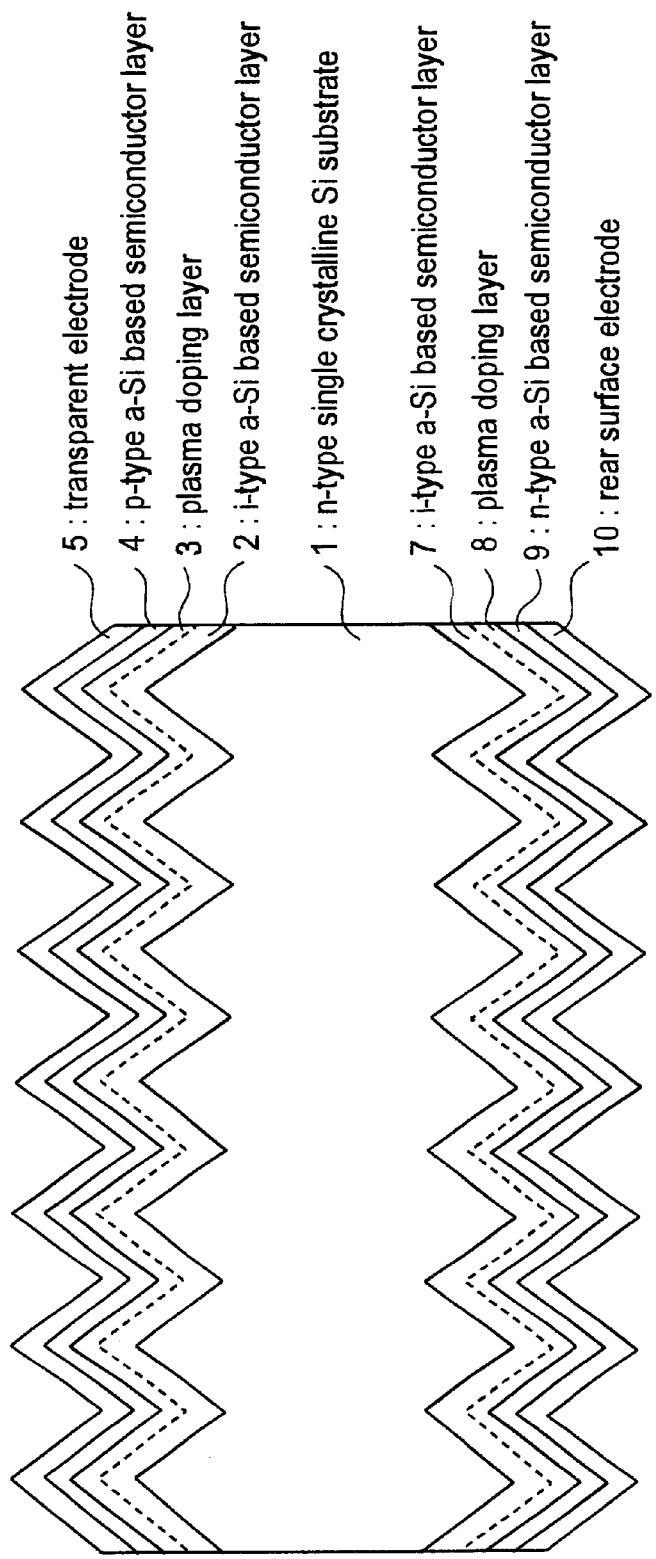
FIG. 2 is a cross sectional view illustrating a photovoltaic device according to another embodiment of this invention.

Explanation is made of the fifth embodiment by referring to FIG. 2. The p-n junction in the structure of FIG. 2 is the same as in the first to fourth embodiments, thus the explanation of the p-n junction is omitted and explanation of high-low junction is only made.

A textured rear surface of the single crystalline silicon substrate 1 is exposed to hydrogen plasma and the surface is cleaned. Then, an i-type hydrogenated amorphous silicon base semiconductor layer 7 of approximately 200 Å is formed on a textured light receiving surface on a rear surface side of the single crystalline silicon substrate 1 by plasma CVD using $SiH_4$ gas. The single crystalline silicon substrate 1 with the hydrogenated amorphous silicon base semiconductor layer 7 formed thereon is exposed to plasma of phosphine ($PH_3$) gas diluted with $H_2$. Through this process, a phosphor (P) atom of impurity for reducing electric resistance is mixed to a certain depth from a surface of the i-type hydrogenated amorphous silicon base semiconductor layer 7 and a lamination structure of the i-type hydrogenated amorphous silicon base semiconductor layer 7 and the n-type hydrogenated amorphous silicon base semiconductor layer (a plasma doping layer) 8 is formed.

A second n-type hydrogenated amorphous silicon based semiconductor layer 9 of approximately 50 Å is formed on a surface of the n-type hydrogenated amorphous silicon based semiconductor layer 8 including plasma damage by plasma CVD with gas containing $SiH_4$, $PH_3$, $H_2$ in order to improve interface characteristics with the rear surface electrode. In this case, the i-type hydrogenated amorphous silicon based semiconductor layer 7 is required to maintain a state of not containing phosphor in order to maintain good interface characteristics between the n-type single crystalline silicon substrate 1 and the n-type hydrogenated amorphous silicon based semiconductor layer 8 formed by mixing phosphor atoms. The second n-type hydrogenated amorphous silicon base semiconductor layer 9 is required to be formed uniformly in a very thin textured film. The conditions are shown in Table 5. Under these conditions, a part contacting the single crystalline silicon substrate 1 and the hydrogenated amorphous silicon base semiconductor layer with each other can be maintained approximately 150 Å of the i-type by mixing phosphor atoms to a depth of approximately 50 Å from a surface of the i-type hydrogenated amorphous silicon base semiconductor layer. Furthermore, the second n-type hydrogenated amorphous silicon base semiconductor layer is formed uniformly in a very thin textured surface.

TABLE 5

| | Substrate temperature (° C.) | Gas flow rate (sccm) | Pressure (Pa) | RF power (mW/cm$^2$) | Treating time (min) |
|---|---|---|---|---|---|
| i-type a-SiC layer | 150 | SiH$_4$: 10 (CH$_4$: 10) | 26.6 | 30 | |
| Plasma doping layer | 150 | PH$_3$: 2 H$_2$: 98 (CH$_4$: 10) | 26.6 | 50~100 | 2~5 |
| p-type a-SiC layer | 150 | SiH$_4$: 5 (CH$_4$: 5) PH$_3$: 0.2 H$_2$: 9.8 | 26.6 | 30 | |

Transparent electrodes 5, 10 as a transparent conductive film are respectively formed on the hydrogenated amorphous silicon semiconductor layers 4, 9 by sputtering for targeting ITO. Comb-shaped collector electrodes are pattern-formed on the transparent electrodes 5, 10 by depositing Ag using a metal mask.

In the fifth embodiment, although the hydrogenated amorphous silicon carbide is used as a hydrogenated amorphous silicon based semiconductor, hydrogenated amorphous silicon can also be used to provide the same effect.

The photovoltaic device of this invention can have an amorphous semiconductor layer of a uniform thin film formed on the textured surface of the crystalline substrate, and a good interface of the amorphous semiconductor layer and the transparent electrode can be maintained.

Table 6 shows results of comparison of photovoltaic conversion characteristics of the photovoltaic element prepared by the method of this invention and the photovoltaic element formed by the conventional plasma doping.

TABLE 6

| | Voc (V) | Isc (A) | F.F. | Pmax (W) |
|---|---|---|---|---|
| First embodiment | 0.656 | 3.69 | 0.745 | 1.80 |
| Second embodiment | 0.665 | 3.73 | 0.740 | 1.84 |
| Third embodiment | 0.665 | 3.78 | 0.735 | 1.85 |
| Forth embodiment | 0.664 | 3.83 | 0.730 | 1.86 |
| Fifth embodiment | 0.689 | 3.83 | 0.740 | 1.95 |
| 1st example of conventional case | 0.655 | 3.70 | 0.715 | 1.73 |
| 2nd example of conventional case | 0.682 | 3.74 | 0.725 | 1.85 |

It is found from Table 6 that the photovoltaic conversion characteristics of the photovoltaic element of this invention are improved as compared with those of the conventional photovoltaic element. This is because that the good hydrogenated amorphous semiconductor layer of reduced electric resistance formed in a thin film on a surface of the plasma doping layer with plasma damage improves interface characteristics, mainly the fill factor (F.F.), of the hydrogenated amorphous semiconductor layer and the transparent electrode. The first example of conventional element shown in Table 6 is so structured that only an Al electrode is formed on a rear surface and the hydrogenated amorphous silicon semiconductor layer is not formed. The second example of the conventional element is so structured that the i-type and n-type hydrogenated amorphous silicon semiconductor layers are formed both surface sides of the single crystalline silicon substrate.

Even when the rear surface electrode layer is formed of single material Al, a film of ITO, ZnO, $SiO_2$ or the like and a film of high reflective Ag, Au can be laminated on the entire area or a part of the area in order to improve light reflection on the rear surface electrode.

The above embodiment uses the n-type single crystalline silicon substrate 1. The invention is applicable to a case of using a p-type single crystalline silicon substrate and reversing conductivities of the hydrogenated amorphous silicon semiconductor layers containing impurity, and to a case of using a polycrystalline silicon substrate.

The above embodiment is an application of this invention to the photovoltaic device. The embodiment is also applicable to a semiconductor device having hetero junction such as a thin film transistor used in a liquid crystal display or the like.

As described above, the hydrogenated amorphous silicon semiconductor layer is uniformly formed on the textured crystalline silicon substrate, and good interface characteristics of the amorphous semiconductor layer and the electrode can be maintained. Therefore, this invention can provide a semiconductor device of high efficiency at low cost.

Although the present invention has been described and illustrated in detail, it should be clearly understood that the description discloses examples of different embodiments of the invention and is not intended to be limited to the examples or illustrations provided. Any changes or modifications within the spirit and scope of the present invention are intended to be included, the invention being limited only by the terms of the appended claims.

What is claimed is:

1. A manufacturing method of a semiconductor device comprising
   a) a process for forming an amorphous semiconductor layer substantially not containing impurity for reducing electric resistance on a surface of a first conductive type crystalline semiconductor substrate,
   b) a process for forming a second conductive type plasma doping layer from the amorphous semiconductor layer of step a), wherein a part of the amorphous semiconductor layer turns into the second conductive type plasma doping layer and another part of the amorphous semiconductor layer is remaining on the first conductive type crystalline semiconductor substrate, said process comprising diffusing impurity on the amorphous semiconductor layer by exposing the amorphous semiconductor layer formed on the crystalline semiconductor substrate in an atmosphere of excited gas containing the second conductive type impurity, and c) a process for forming an amorphous semiconductor thin film layer containing the second conductive type impurity by chemical vapor deposition on the plasma doping layer.

2. The manufacturing method of the semiconductor device according to claim 1, wherein a surface of the crystalline substrate is textured.

3. The manufacturing method of the semiconductor device according to claim 1, wherein the amorphous semiconductor layer substantially not containing the impurity for reducing electric resistance formed on the crystalline semiconductor substrate is hydrogenated amorphous silicon.

4. The manufacturing method of the semiconductor device according to claim 3, wherein the second conductive type plasma doping layer is a thin film of 10–50 Å.

5. The manufacturing method of the semiconductor device according to claim 1, wherein the amorphous semiconductor layer substantially not containing the impurity for reducing electric resistance on a surface of the crystalline semiconductor substrate is hydrogenated amorphous silicon carbide.

6. The manufacturing method of the semiconductor device according to claim 5, wherein the second conductive type plasma doping layer is a thin film of 20–100 Å.

7. The manufacturing method of the semiconductor device according to claim 5, wherein the amorphous semiconductor layer substantially not containing impurity for reducing electric resistance on a surface of the crystalline semiconductor substrate is hydrogenated amorphous silicon carbide, and a process for diffusing the impurity to the hydrogenated amorphous silicon carbide layer by exposing the hydrogenated amorphous silicon carbide layer in an atmosphere of excited gas containing the second conductive type impurity includes a process for mixing gas containing carbon.

8. The manufacturing method of the semiconductor device according to claim 5, wherein the second conductive type amorphous semiconductor thin film layer formed by the chemical vapor deposition is hydrogenated amorphous silicon carbide.

9. The manufacturing method of the semiconductor device according to claim 1, wherein a reaction chamber for forming the amorphous semiconductor layer substantially not containing impurity for reducing electric resistance and a reaction chamber for forming the amorphous semiconductor thin film layer containing the second conductive type impurity are separated, and a process for diffusing the impurity to the amorphous semiconductor layer by exposing the amorphous semiconductor layer formed on the crystalline semiconductor substrate in an atmosphere of excited gas containing the second conductive type of impurity is conducted in the reaction chamber for forming the amorphous semiconductor thin film layer containing the second conductive type impurity.

10. The manufacturing method of claim 1, wherein the part of the amorphous semiconductor layer remaining on the conductive type plasma doping layer has a thickness of 10 to 250 Å.

11. A manufacturing method of a semiconductor device comprising a) a process for forming an amorphous semiconductor layer substantially not containing impurity for reducing electric resistance on a first surface of a first conductive type crystalline semiconductor substrate, b) a process for forming a second conductive type plasma doping layer from the amorphous semiconductor layer of step a), wherein a part of the amorphous semiconductor layer turns into the second conductive type plasma doping layer and another part of the amorphous semiconductor layer is remaining on the first conductive type crystalline semiconductor substrate, said process comprising diffusing impurity on the amorphous semiconductor layer by exposing the amorphous semiconductor layer formed on the crystalline semiconductor substrate in an atmosphere of excited gas containing the second conductive type impurity, and c) a process for forming an amorphous semiconductor thin film layer containing the second conductive type impurity by chemical vapor deposition on the plasma doping layer, d) a process for forming an amorphous semiconductor layer substantially not containing impurity for reducing electric resistance on a second surface of the first conductive type crystalline semiconductor substrate, e) a process for forming the second conductive type plasma doping layer from the amorphous semiconductor layer of step d), wherein a part of the amorphous semiconductor layer turns into the second conductive type plasma doping layer and another part of the amorphous semiconductor layer is remaining on the first conductive type crystalline semiconductor substrate, said process comprising diffusing impurity on the amorphous semiconductor layer by exposing the amorphous semiconductor layer formed on the crystalline semiconductor substrate in an atmosphere of excited gas containing the second conductive type impurity, and f) a process for forming an amorphous semiconductor thin film layer containing the first conductive type impurity by chemical vapor deposition on the plasma doping layer.

* * * * *